(12) United States Patent
Lee et al.

(10) Patent No.: US 12,320,708 B2
(45) Date of Patent: Jun. 3, 2025

(54) PHASE SHIFT MEASURING DEVICE AND PHASE SHIFT MEASURING METHOD

(71) Applicant: Electronics and Telecommunications Research Institute, Daejeon (KR)

(72) Inventors: Il Min Lee, Daejeon (KR); Da Hye Choi, Daejeon (KR); Mugeon Kim, Daejeon (KR); Kyung Hyun Park, Daejeon (KR); Dong Woo Park, Daejeon (KR); Jun-Hwan Shin, Daejeon (KR); Eui Su Lee, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 236 days.

(21) Appl. No.: 18/316,027

(22) Filed: May 11, 2023

(65) Prior Publication Data

US 2023/0366741 A1    Nov. 16, 2023

(30) Foreign Application Priority Data

May 13, 2022   (KR) ......................... 10-2022-0059189

(51) Int. Cl.
   *G01J 9/04*       (2006.01)
(52) U.S. Cl.
   CPC ...................................... *G01J 9/04* (2013.01)
(58) Field of Classification Search
   CPC ........................................................ G01J 9/04
   See application file for complete search history.

(56) References Cited

U.S. PATENT DOCUMENTS

| 7,915,587 B2 | 3/2011 | Federici |
| 8,599,893 B2 | 12/2013 | Kim et al. |
| 9,337,888 B2 | 5/2016 | Glanzer et al. |

(Continued)

FOREIGN PATENT DOCUMENTS

| JP | 2013-195224 | 9/2013 |
| JP | 2015-530005 | 10/2015 |

(Continued)

OTHER PUBLICATIONS

Kim et al., "Photonics-based Terahertz Wireless Communication", Electronics and Telecommunications Trends, 2019, pp. 75-85.

*Primary Examiner* — Thanh Luu
(74) *Attorney, Agent, or Firm* — KILE PARK REED & HOUTTEMAN PLLC (57) ABSTRACT

Disclosed is a phase shift measuring device, which includes a dual mode laser including a first beat light source generating a first beating signal and a second beat light source generating a second beating signal, and that outputs a dual mode signal including the first beating signal and the second beating signal, a first splitter that receives the dual mode signal to generate a first branch signal and a second branch signal, the first branch signal and the second branch signal being including the branched first beating signal and the branched second beating signal, respectively, a phase control unit that receives the first branch signal and to generate a combined signal, a transmitting end that receives the combined signal from the phase control unit and generates a transmission signal based on the combined signal, and a receiving end.

20 Claims, 8 Drawing Sheets

(56) References Cited

U.S. PATENT DOCUMENTS

| | | |
|---|---|---|
| 9,404,853 B1 | 8/2016 | Demers et al. |
| 11,609,474 B2 | 3/2023 | Lee et al. |
| 2009/0283680 A1* | 11/2009 | Logan, Jr. .................. G01J 3/42 |
| | | 250/339.07 |
| 2015/0090906 A1 | 4/2015 | Kim et al. |
| 2021/0281045 A1 | 9/2021 | Kim et al. |

FOREIGN PATENT DOCUMENTS

| | | |
|---|---|---|
| KR | 10-1746508 | 6/2017 |
| KR | 10-2019-0059118 | 5/2019 |
| KR | 10-2101921 | 4/2020 |
| KR | 10-2021-0112561 | 9/2021 |
| KR | 10-2022-0046855 | 4/2022 |

* cited by examiner

PHASE SHIFT MEASURING DEVICE AND PHASE SHIFT MEASURING METHOD

CROSS-REFERENCE TO RELATED APPLICATIONS

This application claims priority under 35 U.S.C. § 119 to Korean Patent Application No. 10-2022-0059189, filed on May 13, 2022, in the Korean Intellectual Property Office, the disclosures of which are incorporated by reference herein in their entireties.

BACKGROUND

Embodiments of the present disclosure described herein relate to a terahertz wireless communication, and more particularly, relate to a phase shift measuring device and a phase shift measuring method using a double mode laser.

Due to the expansion of mobile devices and the increase in multimedia services, the necessity of broadband short-range wireless communication for innovative next-generation communication is emerging. As the amount of communication increases, the speed of wireless communication is also required. To increase the speed of wireless communication, the carrier frequency should be increased by default. The recent commercial 5G wireless communication has increased the carrier frequency to improve the transmission rate than 4G wireless communication, and the 3.5 GHz and 28 GHz carrier frequency bands were allocated for 5G wireless communication.

The next-generation wireless communication, 6G wireless communication requires higher transmission speed. When 6G wireless communication is introduced, the speed of wireless communication will be flooded with the speed of wired communication. To realize the speed of wireless communication similar to the transmission speed of the wired communication, the wireless communication network should use a carrier frequency of 100 GHz or more. Thus, the wireless network of the Terahertz band may be used to build a 6G wireless communication network.

The terahertz waves refer to an electromagnetic wave having a frequency of 0.1 to 10 THz (1 THz=1012 Hz). The terahertz waves are shorter than millimeter waves, so they have high straightness, beam collective, and high permeability for non-metals or non-frivolous substances than visible light and infrared rays. In addition, since the photon energy of the terahertz wave is only a few MEVs, the use of the terahertz wave is harmless to the human body and the range of use is extensive. To commercialize the terahertz wave based on the above advantages, the necessity of research on devices for generating more efficient terahertz wave has emerged.

SUMMARY

Embodiments of the present disclosure provide a device for measuring a phase shift by a sample using a double mode laser.

According to an embodiment of the present disclosure, a phase shift measuring device includes a dual mode laser including a first beat light source generating a first beating signal and a second beat light source generating a second beating signal, and that outputs a dual mode signal including the first beating signal and the second beating signal, a first splitter that receives the dual mode signal to generate a first branch signal and a second branch signal, the first branch signal and the second branch signal being including the branched first beating signal and the branched second beating signal, respectively, a phase control unit that receives the first branch signal and to generate a combined signal, a transmitting end that receives the combined signal from the phase control unit and generates a transmission signal based on the combined signal, and a receiving end that receives the second branch signal from the first splitter and generates a reference signal based on the second branch signal, and the phase control unit includes a second splitter that branches the first branch signal to generate a third branch signal and a fourth branch signal, a phase adjuster that adjusts a phase of the third branch signal, and a combiner that generates the combined signal by combining the third branch signal of which the phase is adjusted by the phase adjuster and the fourth branch signal, and the receiving end includes a reception antenna that receives the transmission signal, and a phase analyzer that measures a phase shift based on the reference signal and the received transmission signal.

According to an embodiment of the present disclosure, a phase shift measuring method includes outputting a dual mode signal including a first beating signal and a second beating signal through a dual mode laser, generating a first branch signal and a second branch signal by branching the dual mode laser, the first branch signal and the second branch signal being including the branched first beating signal and the branched second beating signal, respectively, receiving the first branch signal to generate a combined signal, receiving the combined signal to generate a transmission signal at a terahertz band, generating a reference signal based on the second branch signal, and receiving the transmission signal to measure a phase shift value based on the received transmission signal and the reference signal, and the generating of the combined signal includes branching the first branch signal to generate a third branch signal and a fourth branch signal, adjusting a phase of the third branch signal, and generating the combined signal by combining the third branch signal of which the phase is adjusted and the fourth branch signal.

According to an embodiment of the present disclosure, a phase shift measuring device includes a dual mode laser including a first beat light source generating a first beating signal and a second beat light source generating a second beating signal and that outputs a dual mode signal including the first beating signal and the second beating signal, a first splitter that receives the dual mode signal to generate a first branch signal and a second branch signal, the first branch signal and the second branch signal being including the branched first beating signal and the branched second beating signal, respectively, a transmitting end that receives the first branch signal to generate a transmission signal based on the first branch signal, a phase control unit that receives the second branch signal to generate a combined signal, and a receiving end that receives the combined signal from the phase control unit and generates a reference signal based on the combined signal, and the phase control unit includes a second splitter that branches the second branch signal to generate a third branch signal and a fourth branch signal, a phase adjuster that adjusts a phase of the third branch signal, and a combiner that generates the combined signal by combining the third branch signal of which the phase is adjusted by the phase adjuster and the fourth branch signal, and the receiving end includes a reception antenna that receives the transmission signal, and a phase analyzer that measures a phase shift based on the reference signal and the received transmission signal.

BRIEF DESCRIPTION OF THE FIGURES

A detailed description of each drawing is provided to facilitate a more thorough understanding of the drawings referenced in the detailed description of the present disclosure.

DETAILED DESCRIPTION

Hereinafter, embodiments of the present disclosure may be described in detail and clearly to such an extent that an ordinary one in the art easily implements the present disclosure.

The terms used in the specification are provided to describe the embodiments, not to limit the present disclosure. In the present specification, the singular form also includes the plural form unless otherwise specified in the phrase. The terms "comprises" and/or "comprising" when used in the specification, specify the presence of steps, operations, elements, and/or components, but do not preclude the presence or addition of one or more other steps, operations, elements, components, and/or groups thereof.

Unless otherwise defined, all terms (including technical and scientific terms) used in the specification should have the same meaning as commonly understood by those skilled in the art to which the inventive concept pertains. In addition, terms defined in the commonly used dictionary are not interpreted ideally or excessively unless explicitly defined specifically. In the present specification, the same reference numerals may refer to the same components throughout the entire text.

Hereinafter, with reference to the drawings, embodiments of a phase shift measuring device PHSD according to the present disclosure will be described in detail.

Figure 1:
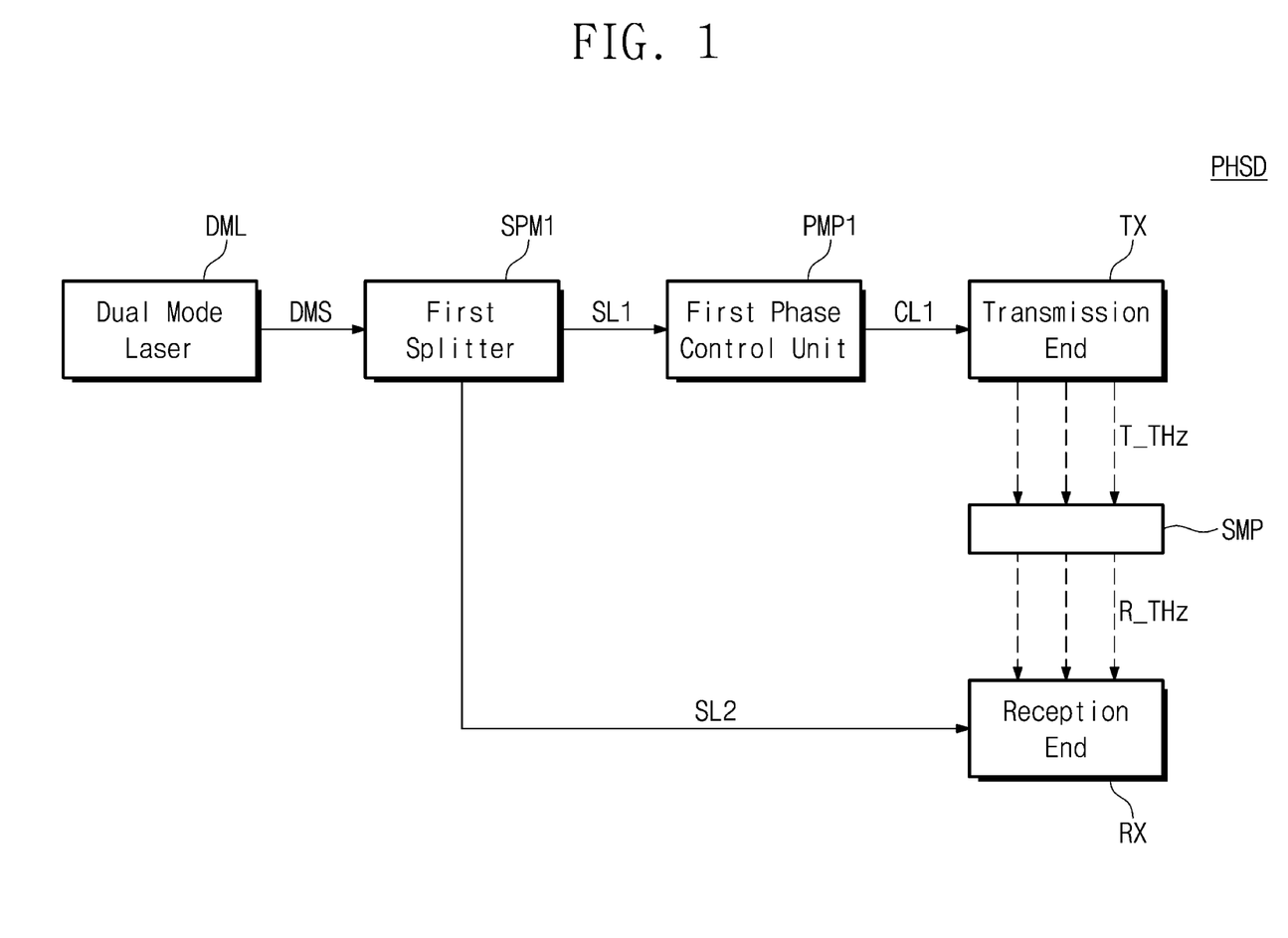
FIG. 1 is a diagram illustrating a first embodiment of a phase shift measuring device, according to the present disclosure.
Figure 2:
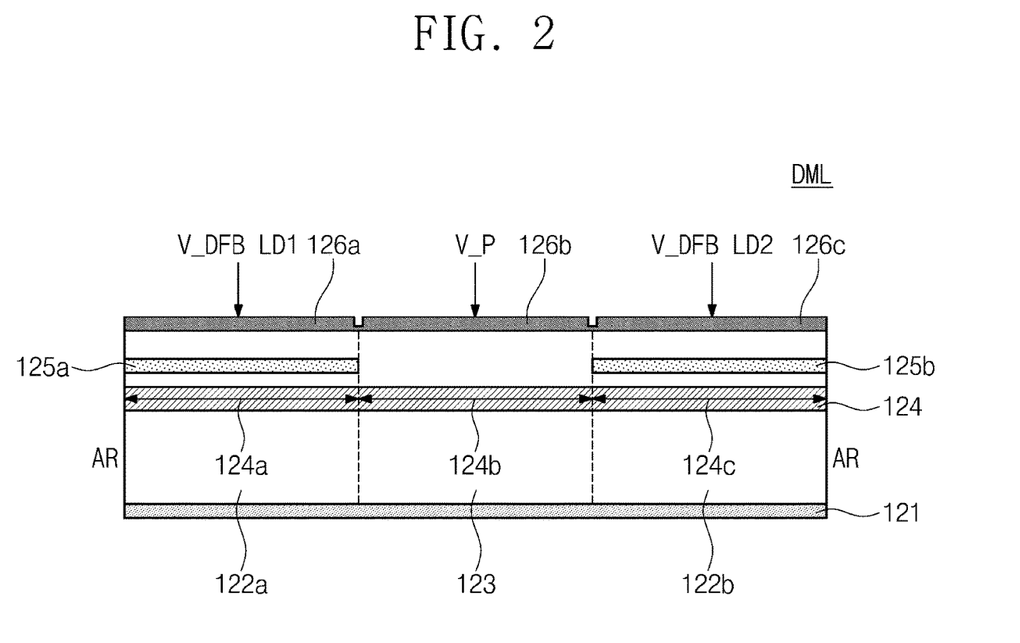
FIG. 2 is a diagram for describing a specific configuration and an operation of a first phase control unit of FIG. 1.
Figure 3:
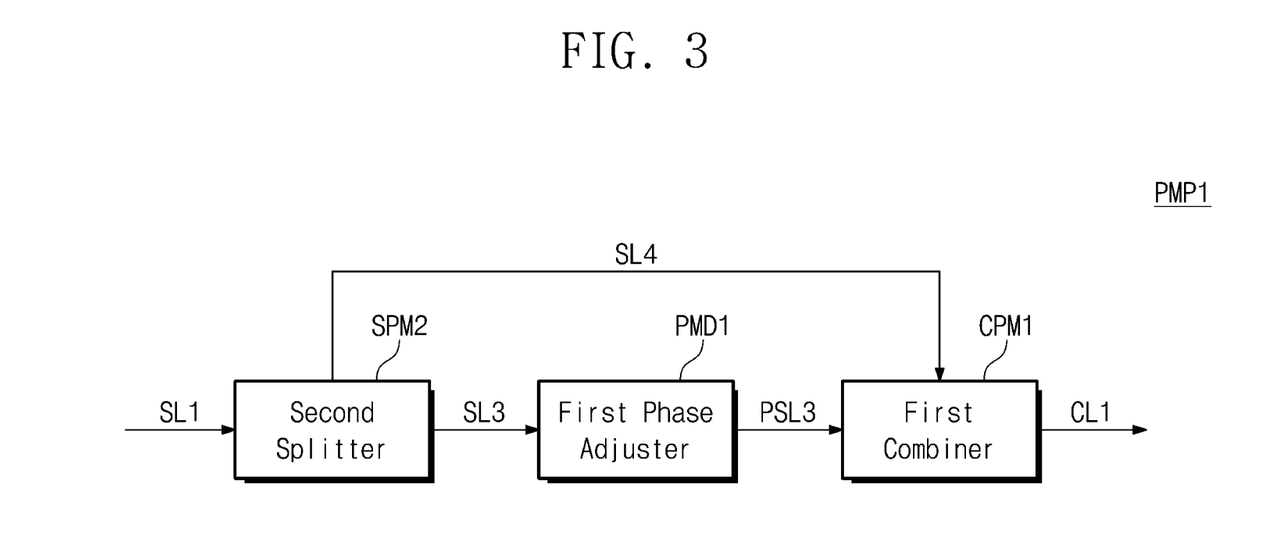
FIG. 3 is a diagram for describing a specific configuration and an operation of a transmitting end of FIG. 1.
Figure 4:
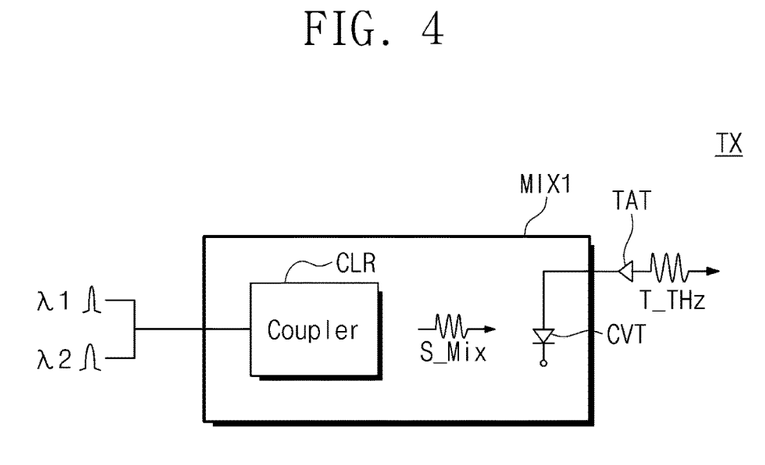
FIG. 4 is a diagram for describing a specific configuration and an operation of a receiving end of FIG. 1.

FIG. 1 is a diagram illustrating a first embodiment of a phase shift measuring device, according to the present disclosure. FIG. 2 is a diagram for describing a specific configuration and an operation of a first phase control unit of FIG. 1. FIG. 3 is a diagram for describing a specific configuration and an operation of a transmitting end of FIG. 1. FIG. 4 is a diagram for describing a specific configuration and an operation of a receiving end of FIG. 1. Hereinafter, with reference to FIGS. 1 to 4, a first embodiment of a phase shift measuring device PHSD according to the present disclosure will be described in detail.

Referring to FIG. 1, in a first embodiment, the phase shift measuring device PHSD may include a dual mode laser DML, a first splitter SPM1, a first phase control unit PMP1, a transmitting end TX, and a receiving end RX.

The phase shift measuring device PHSD may generate a transmission signal T_THz for measuring a phase shift by a sample. The transmission signal T_THz may have a frequency at a terahertz band.

The dual mode laser DML may include a beating light source. The beating light source may include a first light source and a second light source which generate a beating signal, respectively. Each of the first light source and the second light source may be a single mode laser. The first light source may generate the first beating signal, and the second light source may generate the second beating signal.

The first beating signal and the second beating signal may have different oscillation frequencies. A difference between oscillation frequencies of the first beating signal and the second beating signal is referred to as a beating frequency. The dual mode laser DML may generate and output a dual mode signal DMS including the first beating signal and the second beating signal.

The first splitter SPM1 may receive the dual mode signal DMS from the dual mode laser DML. The first splitter SPM1 may be configured to branch the received dual mode signal DMS. The first beating signal and the second beating signal included in the dual mode signal DMS may be branched by the first splitter SPM1.

The first splitter SPM1 may branch the dual mode signal DMS to output a first branch signal SL1 and a second branch signal SL2. The first branch signal SL1 may include the branched first beating signal and the branched second beating signal. The first beating signal and the second beating signal included in the first branch signal SL1 may have the same frequency as the first beating signal and the second beating signal included in the dual mode signal and may have less strength than the first beating signal and the second beating signal included in the dual mode signal. The second branch signal SL2 may be output with the same frequency, the same strength, and the same phase as the first branch signal SL1.

The first phase control unit PMP1 may receive the first branch signal SL1 output from the first splitter SPM1. The first phase control unit PMP1 may generate a third branch signal SL3 and a fourth branch signal SL4 by branching the first branch signal SL1. The first phase control unit PMP1 may adjust a phase of the third branch signal SL3 and may output a first combined signal CL1 by combining the adjusted third branch signal SL3 with the fourth branch signal SL4.

The transmitting end TX may receive and mix two beating signals having different frequencies included in the first combined signal CL1. The transmitting end TX may mix the two beating signals and may generate the transmission signal T_THz, which is a continuous wave in the terahertz band, based on the mixed beating signals. The transmission signal T_THz generated by the transmitting end TX may be radiated into a free space.

The transmission signal T_THz may be irradiated toward a sample SMP. The transmission signal T_THz may pass through the sample SMP. A phase may be shifted while the transmission signal T_THz passes through the sample SMP. A phase shift value may be different according to types of sample SMP. The phase shift measuring device PHSD of the present disclosure may be configured to measure a phase shift value for the specific sample SMP.

The receiving end RX may receive a reception signal R_THz. The reception signal R_THz may be the transmission signal T_THz having a phase shifted by passing through the sample SMP. The receiving end RX may measure the phase shift value by the sample SMP by detecting the received transmission signal T_THz.

The receiving end RX may receive the second branch signal SL2 output from the first splitter SPM1. The receiving end RX may receive and mix two beating signals having different frequencies included in the second branch signal SL2. The receiving end RX may mix the two beating signals and may generate a reference signal Ref_THz, which is a continuous wave in the terahertz band, based on the mixed beating signals.

The receiving end RX may measure the phase shift value by the sample SMP based on the reception signal R_THz and the reference signal Ref_THz. Hereinafter, with reference to FIGS. 2 to 5, in the first embodiment of the present disclosure, a specific configuration and operation of the dual mode laser DML, the first phase control unit PMP1, the transmitting end TX, and the receiving end RX will be described.

FIG. 2 is a diagram illustrating a configuration of a dual mode laser, according to an embodiment of the present disclosure.

Referring to FIG. 2, the dual mode laser DML may include a first single mode laser 122a, a gain control region 123, and a second single mode laser 122b. The first single mode laser 122a and the second single mode laser 122b may be spaced apart from each other and stacked on a substrate 121. The gain control region 123 may be formed between the first single mode laser 122a and the second single mode laser 122b. The substrate 121 may be a compound semiconductor substrate. For example, the substrate 121 may be a gallium arsenide (GaAs) substrate, an indium phosphide (InP) substrate, or a gallium nitride (GaN) substrate. Sides of the dual mode laser DML may be anti-reflection (AR) coated.

The first single mode laser 122a, the gain control region 123, and the second single mode laser 122b may share an active layer 124. The active layer 124 may include InGaAsP, InAlGaAs, or InAlAs. The active layer 124 may have a multi quantum well (MQW) structure. The first single mode laser 122a may include a first diffraction grating 125a. A first electrode plate 126a may be attached to an upper portion of the first single mode laser 122a. A second electrode plate 126c may be attached to an upper portion of the gain control region 123. The second single mode laser 122b may include a second diffraction grating 125b. A third electrode plate 126c may be attached to an upper portion of the second single mode laser 122b. Diffraction periods of the first diffraction grating 125a and the second diffraction grating 125b may be different.

The first single-mode laser 122a and the second single-mode laser 122b may be a distributed feedback laser diode (DFB LD), a distributed Bragg reflector laser diode (DBR LD), a sampled grating distributed Bragg reflector (SGDBR) laser diode (SGDBR LD), or a wavelength tunable single mode laser diode. The wavelength tunable single mode laser may be a wavelength tunable single mode laser using an Electro-Optic (EO) or a Thermal-Optic (TO) effect in an External Cavity Diode Laser (ECDL).

The first single mode laser 122a may receive a voltage V_DFB LD1 through the first electrode plate 126a. The second single mode laser 122b may receive a voltage V_DFB LD2 through the third electrode plate 126c. The voltages V_DFB LD1 and V_DFB LD2 applied to the first electrode plate 126a and the third electrode plate 126c may be forward bias voltages. An active layer 124a included in the first single mode laser 122a and an active layer 124c included in the second single mode laser 122b may operate as gain layers. Accordingly, the first single mode laser 122a and the second single mode laser 122b may respectively generate light. In this case, since the diffraction periods of the first diffraction grating and the second diffraction grating are different, an operating wavelength of the first beating signal generated from the first single mode laser 122a may be different from that of the second beating signal generated from the second single mode laser 122b. The first single mode laser 122a may output the first beating signal to the gain control region 123 located at the rear end of the first single mode laser 122a.

The gain control region 123 may receive a voltage V_P through the second electrode plate 126b. The voltage V_P applied to the gain control region 123 may be a reverse bias voltage. An active layer 124b included in the gain control region 123 may function as an absorption layer. Thus, the gain control region 123 may absorb light. The gain control region 123 may absorb light and may modulate the first beating signal generated by the first single mode laser 122a. The gain control region 123 may output the modulated first beating signal to the outside of the dual mode laser DML. The second single mode laser 122b may output the generated second beating signal to the outside of the dual mode laser DML. The dual mode laser DML may output the dual mode signal DMS including the modulated first beating signal and second beating signal.

The dual mode signal DMS generated by the dual mode laser DML may be incident to a first photo mixer MIX1 of the transmitting end TX through the first splitter SPM1 and the first phase control unit PMP1. Physical characteristics of the transmission signal T_THz generated by the transmitting end TX may be determined by laser line widths, noise characteristics, a tuning range, a phase stability, and the like of the first and second light sources included in the dual mode laser DML.

FIG. 3 is a diagram illustrating a configuration of a first phase control unit, according to an embodiment of the present disclosure.

Referring to FIG. 3, the first phase control unit PMP1 may include a second splitter SPM2, a first phase adjuster PMD1, and a first combiner CPM1. The first phase control unit PMP1 may receive the first branch signal SL1 and may output the first combined signal CL1.

The second splitter SPM2 may be configured to branch the received first branch signal SL1. The first beating signal and the second beating signal included in the first branch signal SL1 may be branched by the second splitter SPM2.

The second splitter SPM2 may branch the first branch signal SL1 to output the third branch signal SL3 and the fourth branch signal SL4. The third branch signal SL3 may include the branched first beating signal and the branched second beating signal. The first beating signal and the second beating signal included in the third branch signal SL3 may have the same frequency as the first beating signal and the second beating signal included in the first branch signal SL1 and may have less strength than the first beating signal and the second beating signal included in the first branch signal SL1. The fourth branch signal SL4 may be output with the same frequency, the same strength, and the same phase as the third branch signal SL3.

The first phase adjuster PMD1 may receive the third branch signal SL3. The first phase adjuster PMD1 may adjust a phase of the third branch signal SL3. By the first phase adjuster PMD1, each of the phase values of the first beating signal and the second beating signal included in the third branch signal SL3 may increase or decrease by an amount corresponding to an adjustment phase value. The first phase adjuster PMD1 may output a third branch signal PSL3 of which the phase is adjusted.

The first combiner CPM1 may receive the fourth branch signal SL4 and the third branch signal PSL3 of which the phase is adjusted. The first combiner CPM1 may be configured to generate and output the first combined signal CL1 by combining the fourth branch signal SL4 and the third branch signal PSL3 of which the phase is adjusted.

FIG. 4 is a diagram illustrating a configuration of the transmitting end TX, according to an embodiment of the present disclosure.

The transmitting end TX according to an embodiment of the present disclosure may include the first photo mixer MIX1 and a transmission antenna TAT. The first photo mixer MIX1 may mix the first beating signal and the second beating signal included in the first combined signal CL1.

The first photo mixer MIX1 may modulate a current supplied to the first photo mixer MIX1 based on the beating frequencies of the mixed beating signals. Based on the modulated current, the first photo mixer MIX1 may generate the transmission signal T_THz. The frequency of the transmission signal T_THz may be in a terahertz band. The transmission signal T_THz may be output to the transmission antenna TAT serially connected to the first photo mixer MIX1. The transmit antenna TAT may radiate the transmission signal T_THz into a free space.

The first photo mixer MIX1 may include a coupler CLR and an optical-to-electrical converter CVT. The first photo mixer MIX1 may generate the transmission signal T_THz by using the beating signals included in the first combined signal. The generated transmission signal T_THz may be a terahertz continuous wave.

The drawing illustrated in FIG. 4 is only for helping understanding the principle of the first photo mixer MIX1, and does not limit the structure of the first photo mixer MIX1. For example, the first photo mixer MIX1 may include a unitravelling carrier photodiode UTC-PD, an evanescent photodiode EC-PD, or a low temperature grown (LTG) photo mixer.

The coupler CLR may generate a mixed beating signal S_Mix by mixing a first beating signal λ1 and a second beating signal λ2 included in the first combined signal CL1. The frequency of the mixed beating signal S_Mix is the same as a frequency difference between the first beating signal λ1 and the second beating signal λ2. The mixed beating signal S_Mix mixed in the coupler CLR may be incident to the optical-to-electrical converter CVT.

The optical-to-electrical converter CVT may generate the transmission signal T_THz by modulating a photo current of the photodiode based on the incident mixed beating signal S_Mix. The magnitude of the transmission signal T_THz may be proportional to a dot product of the light strength of the first beating signal λ1 and the second beating signal λ1. The transmission signal T_THz generated by the optical-to-electrical converter CVT is output to the transmission antenna TAT connected in series with the first photo mixer MIX1, and may be radiated from the transmission antenna TAT to a free space.

Figure 5:
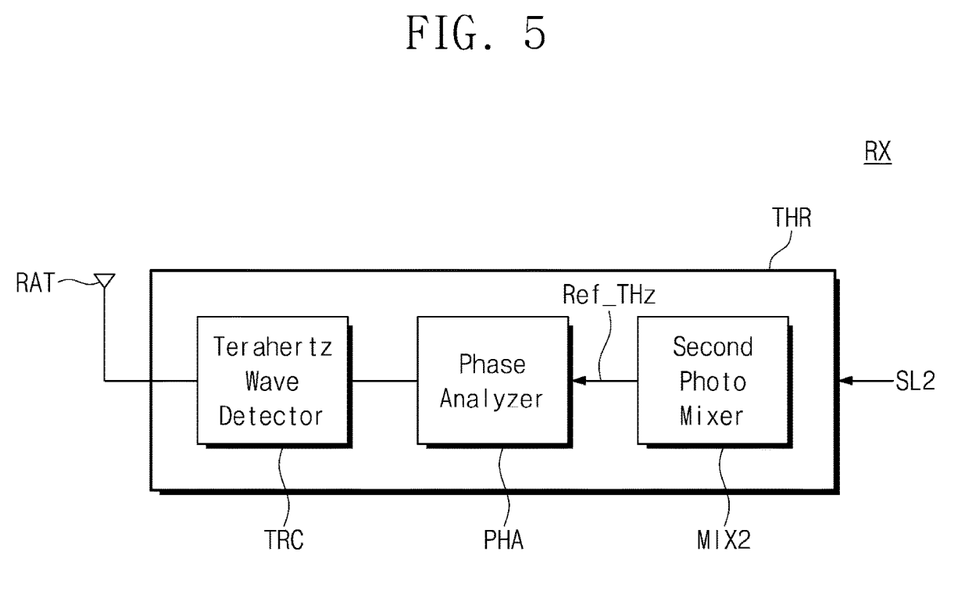
FIG. 5 is a diagram illustrating a configuration of a receiving end, according to an embodiment of the present disclosure.

FIG. 5 is a diagram illustrating a configuration of a receiving end, according to an embodiment of the present disclosure.

Referring to FIG. 5, the receiving end RX may include a reception antenna RAT and a terahertz wave reception device THR. The terahertz wave reception device THR may include a terahertz wave detector TRC, a phase analyzer PHA, and a second photo mixer MIX2.

A transmission signal (hereinafter, referred to as the reception signal R_THz) passed through the sample may be received to the reception antenna RAT. The reception signal R_THz received through the reception antenna RAT may be output to the phase analyzer PHA.

The terahertz wave detector TRC may separate a carrier signal and a baseband signal of the input transmission signal T_THz. The terahertz wave detector TRC may use a heterodyne reception method using a schottky barrier diode (SBD) or a mixer and a local oscillator (LO). The schottky barrier diode terahertz wave detector may be a III-V based schottky barrier diode type terahertz wave detector, a CMOS (Complementary Metal Oxide Semiconductor) based schottky barrier diode type terahertz wave detector, or a focal plane array (FPA) type terahertz wave detector.

The terahertz wave reception device THR may receive the second branch signal SL2. The second branch signal SL2 may be incident to the second photo mixer MIX2. The second photo mixer MIX2 may generate the reference signal Ref_THz by mixing the first and second beating signals included in the second branch signal SL2. A specific configuration and operation of the second photo mixer MIX2 may be actually the same as that of the first photo mixer MIX1.

The phase analyzer PHA may measure a phase shift value by the sample based on the second branch signal SL2 and the reception signal R_THz. Hereinafter, an operation of the phase analyzer PHA in a first embodiment of the present disclosure will be described in detail.

Referring back to FIG. 3, the first beating signal included in the third branch signal SL3 may have a first frequency ω1, and the second beating signal included in the third branch signal SL3 may have a second frequency ω2. The electric field E_BT1 of the first beating signal and the electric field E_BT2 of the second beating signal included in the third branch signal SL3 may be respectively expressed in a complex number form as illustrated in Equation 1 below.

$$E_{BT1}=A_1\exp[j\omega_1(t-\tau_3)], E_{BT2}=A_2\exp[j\omega_2(t-\tau_2)], \quad \text{[Equation 1]}$$

Like the third branch signal SL3, the fourth branch signal SL4 may include a first beating signal and a second beating signal.

The phase of the third branch signal SL3 may be adjusted by the first phase adjuster PMD1. Accordingly, the electric field of each of the first beating signal and the second beating signal of the third branch signal PSL3 of which the phase is adjusted, output from the phase adjuster, may be expressed in a complex number form as illustrated in Equation 2 below.

$$E_{PSL3\_BT1}=A_1\exp[j\omega_1(t-\tau_1)+\phi_{m1}],$$

$$E_{PSL3\_BT2}=A_2\exp[j\omega_2(t-\tau_2)+\phi_{m1}], \quad \text{[Equation 2]}$$

In Equation 2, $\phi_{m1}$ is an adjustment phase value modulated by the first phase adjuster PMD1.

The first combiner CPM1 may generate the first combined signal CL1 by combining the third branch signal PSL3 of which the phase is adjusted and fourth branch signal SL4. The electric field of the first combined signal CL1 may be expressed in a complex number form as illustrated in Equation 3 below.

$$E_{CL1}=A_1\exp[j\omega_1(t-\tau_1)+\phi_{01}+\phi_{m1}]+A_2\exp[j\omega_2(t-\tau_2)+\phi_{02}+\phi_{m1}]+A_1\exp[j\omega_1(t-\tau_3)+\phi_{03}]+A_2\exp[j\omega_2(t-\tau_4)+\phi_{04}], \quad \text{[Equation 3]}$$

The transmitting end TX may generate photo carriers proportional to the strength of the received first combined signal CL1, and the photo carriers may be radiated by the transmission antenna TAT. Accordingly, the strength of the radiated transmission signal T_THz may be proportional to the strength of the first combined signal CL1.

When the transmission signal T_THz is radiated by the transmission antenna TAT, only a component corresponding to a difference frequency between the first frequency ω1 and the second frequency ω2 may be effectively radiated. Therefore, the transmission signal T_THz radiated by the transmission antenna TAT may be expressed in the form of a complex number as illustrated in Equation 4 below.

$$I_{T\_THz}=I_0\text{Re}\{\exp[j\omega_{THz}t+j\phi_{Tx1}+j(\phi_{m1}-\phi_{m1})]+\exp(j\omega_{THz}t+j\phi_{Tx2}+j\phi_{m1})+\exp(-j\omega_{THz}t+j\phi_{Tx3}+j\phi_{m1})+\exp(-j\omega_{THz}t+j\phi_{Tx4})\}=I_0\{\cos(\omega_{THz}t+j\phi_{Tx2}+\phi_{m1})+\cos(\omega_{THz}t-\phi_{Tx3}+\phi_{m1})+\cos(\omega_{THz}t+\phi_{Tx1})+\cos(\omega_{THz}t+\phi_{Tx4})\},$$  [Equation 4]

In Equation 4, $\omega_{THz}$ represents the difference frequency ω1−ω2 between the first frequency ω1 and the second frequency ω2. $\phi_{Tx1}$, $\phi_{Tx2}$, $\phi_{Tx3}$, and $\phi_{Tx4}$ and are phase offsets.

The phase offsets may be excluded by arranging an optical fiber delay line between the second splitter SPM2 and the first combiner CPM1 and between the first phase adjuster PMD1 and the first combiner CPM1, or through calibration measurement. Accordingly, the strength $I_{T\_THz}$ of the transmission signal T_THz may be simply expressed as in Equation 5 below.

$$I_{T\_THz}=I_0\{\cos(\omega_{THz}t+\phi_{m1})+\cos(\omega_{THz}t-\phi_{m1})+2\cos(\omega_{THz}t)\},$$  [Equation 5]

When the transmission signal T_THz is irradiated toward the sample and passes through the sample, a phase shift may occur due to the sample. Accordingly, the strength $I_{R\_THz}$ of the transmission signal (hereinafter, referred to as the reception signal R_THz) passing through the sample may be expressed as in Equation 6 below.

$$I_{R\_THz}=I_0\{\cos(\omega_{THz}t+\phi_{m1}+\phi_s)+\cos(\omega_{THz}t-\phi_{m1}+\phi_s)+2\cos(\omega_{THz}t+\phi_s)\}=2I_0\{\cos(\omega_{THz}t+\phi_s)\cos(\phi_{m1})+\cos(\omega_{THz}t+\phi_s)\}=2I_0\cos(\omega_{THz}t+\phi_s)[1+\cos(\phi_{m1})],$$  [Equation 6]

In Equation 6, $\phi_s$ is a phase shift value by the sample.

The receiving end RX may receive the reception signal R_THz and may receive the second branch signal SL2. The second branch signal SL2 supplied to the receiving end RX includes a first beating signal and a second beating signal. The strength $I_{Ref\_THz}$ of the reference signal Ref_THz according to the second branch signal SL2 may be expressed as in Equation 7 below by substituting a value of 0 in $\phi_s$ and $\phi_{m1}$ in Equation 6.

$$I_{Ref\_THz} = I_1[\cos(\omega_{THz}t) + \cos(\omega_{THz}t) + 2\cos(\omega_{THz}t)]$$  [Equation 7]
$$= 4I_1\cos(\omega_{THz}t).$$

By the phase analyzer PHA of the receiving end RX, a measurement current $I_m$ obtained by multiplying the strength of the reception signal R_THz (Equation 6) by the strength of the reference signal Ref_THz (Equation 7) may be expressed as in Equation 8 below.

$$I_m = 8I_0I_1\cos(\omega_{THz}t + \phi_s)[1 + \cos(\phi_{m1})]\cos(\omega_{THz}t)$$  [Equation 8]
$$= 4I_0I_1\{\cos(\phi_s) + \cos(2\omega_{THz}t + \phi_s)\}$$
$$[1 + \cos(\phi_{m1})].$$

In the measurement current of Equation 8, the current component for the $2\omega_{THz}$ frequency term may appear as direct current due to too high a frequency in a conventional current meter.

In conclusion, the measurement current $I_m$ measured by the phase analyzer PHA may be expressed as in Equation 9 below.

$$I_m=4I_0I_1\cos(\phi_s)[1+\cos(\phi_{m1})],$$  [Equation 9]

The measured current for the phase adjustment value has a maximum value when the sample does not exist ($\phi_s=0$), and the strength may decrease according to the phase shift value ($\phi_s$) by the sample.

Figure 6:
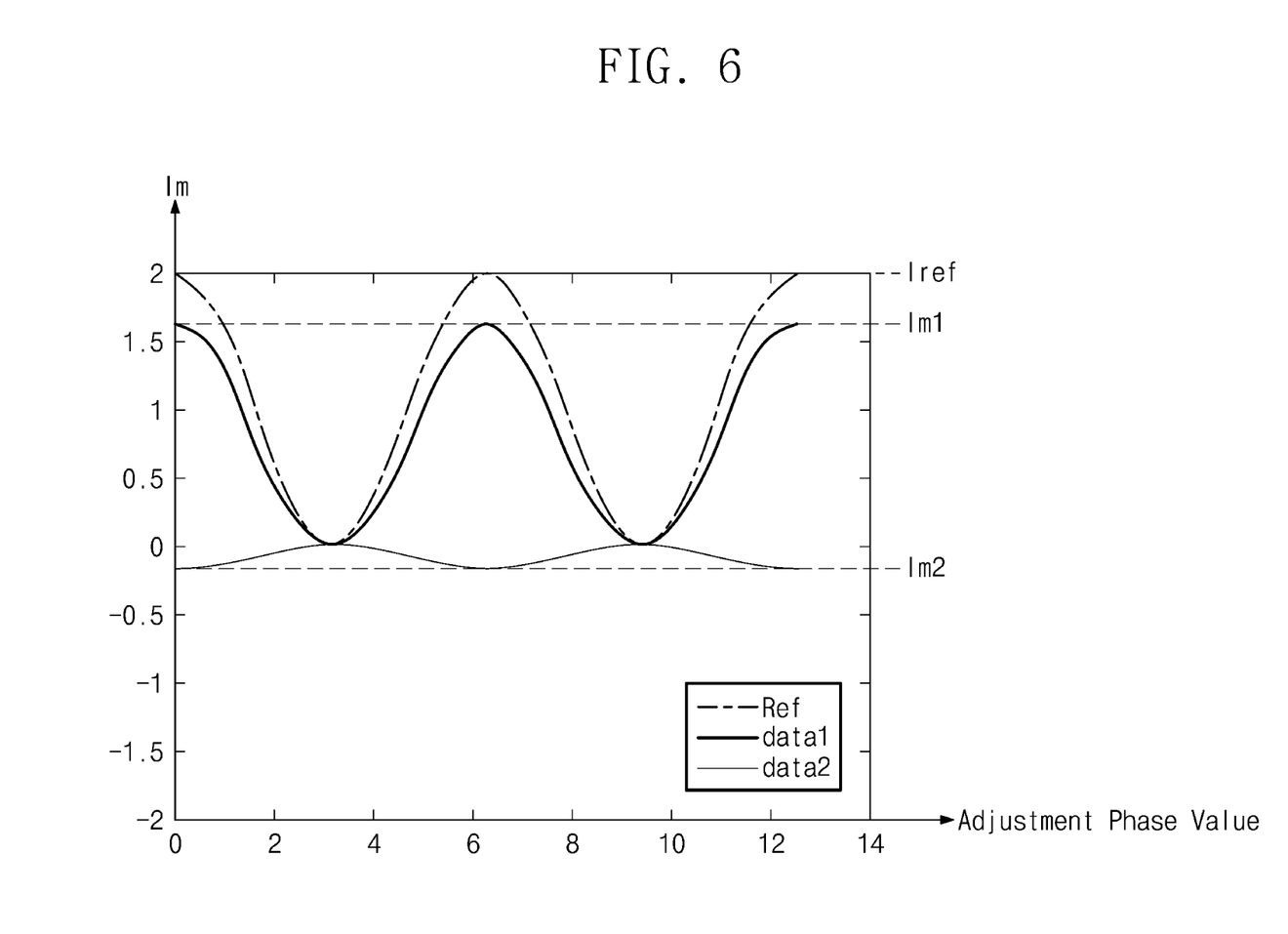
FIG. 6 is a graph of a measurement current with respect to the phase control value measured by a phase analyzer of FIG. 5 in a first embodiment of the present disclosure.

FIG. 6 is a graph of a measurement current with respect to the phase control value measured by a phase analyzer of FIG. 5 in a first embodiment of the present disclosure.

Referring to FIG. 6, the measurement current may have a uniform phase period and a maximum value. The phase analyzer PHA may measure the phase shift value by the sample by comparing the measurement current when the sample is not present with the measurement current when the sample is present. For example, the phase analyzer PHA may compare the maximum value of the measurement current when the sample is not present with the maximum value of the measurement current when the transmission signal T_THz is irradiated toward the sample to measure the phase shift value by the sample.

In the graph of FIG. 6, when there is no sample, the maximum value of the measurement current may be set as a reference value Iref. For example, when the first sample is provided and the transmission signal is irradiated to the first sample, the first measurement value Im1, which is the maximum value of the first measurement current, may be obtained. The first measurement value Im1 may be less than the reference value Iref. The phase analyzer PHA may obtain a phase shift value by the first sample by calculating a ratio of the first measurement value Im1 to the reference value based on Equation 9.

As another example, when a second sample is provided and the transmission signal T_THz is irradiated to the second sample, the second measurement value Im2, which is the maximum value of the second measurement current, may be obtained. The second measurement value Im2 may be a negative number. The phase analyzer PHA may obtain a phase shift value by the second sample by calculating a ratio of the second measurement value Im2 to the reference value based on Equation 9.

Figure 7:
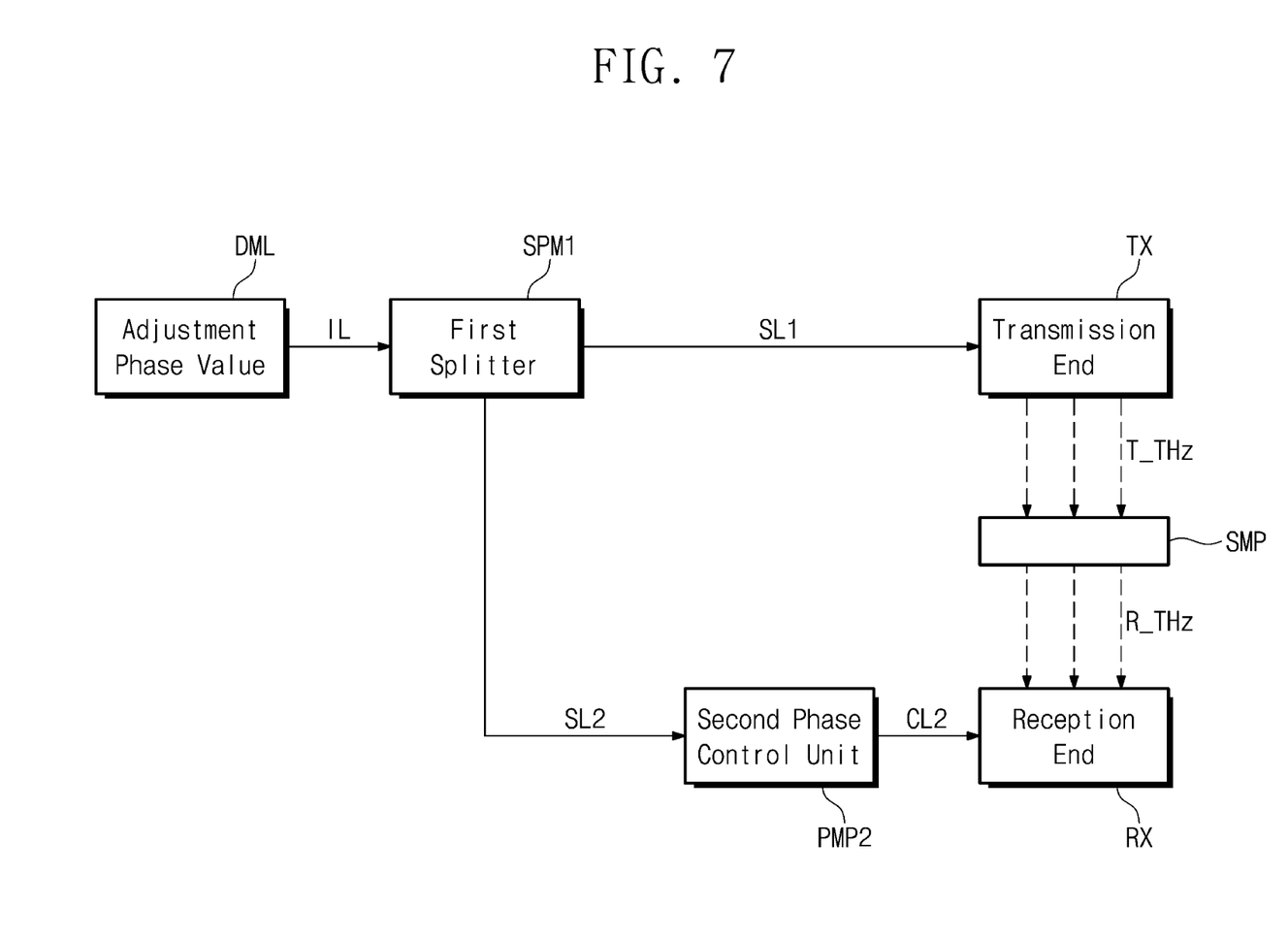
FIG. 7 is a diagram illustrating a second embodiment of a phase shift measuring device, according to the present disclosure.
Figure 8:
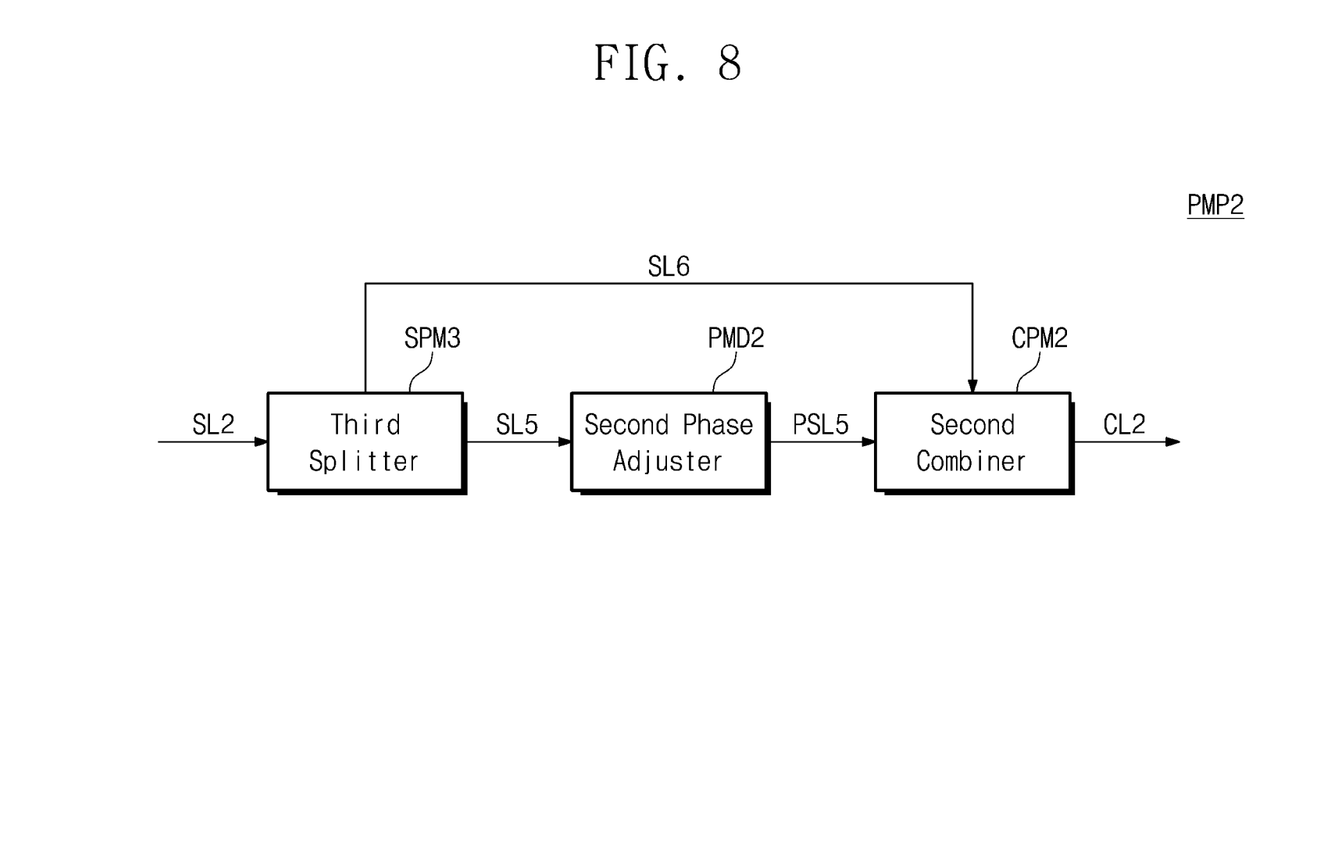
FIG. 8 is a diagram for describing a specific configuration and an operation of a second phase control unit of FIG. 7.

FIG. 7 is a diagram illustrating a second embodiment of a phase shift measuring device, according to the present disclosure. FIG. 8 is a diagram for describing a specific configuration and an operation of a second phase control unit of FIG. 7. Hereinafter, a second embodiment of the phase shift measuring device PHSD according to the present disclosure will be described in detail focusing on differences from the first embodiment described with reference to FIGS. 1 to 5.

Referring to FIG. 7, the phase shift measuring device PHSD of the present disclosure may include the dual mode laser DML, the first splitter SPM1, a second phase control unit PMP2, the transmitting end TX, and the receiving end RX. The dual mode laser DML, the first splitter SPM1, the transmitting end TX, and the receiving end RX may be actually the same as those described with reference to FIGS. 1, 2, 4, and 5. Hereinafter, the second phase control unit PMP2 will be described in detail with reference to FIG. 8.

The second phase control unit PMP2 may include a third divider SPM3, a second phase adjuster PMD2, and a second combiner CPM2. The second phase control unit PMP2 may receive the second branch signal SL2 and may output a second combined signal CL2.

The third splitter SPM3 may be configured to branch the received second branch signal SL2. The first beating signal and the second beating signal included in the second branch signal SL2 may be branched by the third splitter SPM3.

The third splitter SPM3 may branch the second branch signal SL2 to output a fifth branch signal SL5 and a sixth branch signal SL6. The fifth branch signal SL5 may include the branched first beating signal and the branched second beating signal. The first beating signal and the second beating signal included in the fifth branch signal SL5 may have the same frequency as the first beating signal and the second beating signal included in the second branch signal SL2 and may have less strength than the first beating signal and the second beating signal included in the second branch signal SL2. The sixth branch signal SL6 may be output with the same frequency, the same strength, and the same phase as the fifth branch signal SL5.

The second phase adjuster PMD2 may receive the fifth branch signal SL5. The second phase adjuster PMD2 may adjust the phase of the fifth branch signal SL5. Each of the phase values of the first beating signal and the second beating signal included in the fifth branch signal SL5 may be increased or decreased by the second phase adjuster PMD2 by an amount corresponding to the adjustment phase value. The second phase adjuster PMD2 may output a fifth branch signal PSL5 of which the phase is adjusted.

The second combiner CPM2 may receive the sixth branch signal SL6 and the fifth branch signal PSL5 of which the phase is adjusted. The second combiner CPM2 may be configured to generate and output the second combined signal CL2 by combining the sixth branch signal SL6 and the fifth branch signal PSL5 of which the phase is adjusted.

The second phase control unit PMP2 may adjust the phase of the fifth branch signal SL5 and may combine the phase-adjusted fifth branch signal SL5 with the sixth branch signal SL6 to output the second combined signal CL2 to the receiving end RX.

The phase analyzer PHA included in the receiving end RX may measure the phase shift value by the sample based on the second combined signal CL2 and the reception signal R_THz. Hereinafter, an operation of the phase analyzer PHA in the second embodiment of the present disclosure will be described in detail.

Referring back to FIG. 8, the first beating signal included in the fifth branch signal SL5 may have the first frequency $\omega 1$, and the second beating signal included in the fifth branch signal SL5 may have the second frequency $\omega 2$. The electric field E_BT1 of the first beating signal and the electric field E_BT2 of the second beating signal included in the fifth branch signal SL5 may be respectively expressed in a complex number form as in Equation 1 above.

Like the fifth branch signal SL5, the sixth branch signal SL6 may include the first beating signal and the second beating signal.

The phase of the fifth branch signal SL5 may be adjusted by the second phase adjuster PMD2. Accordingly, the electric field $E_{PSL5\_BT1}$ of the first beating signal and the electric field $E_{PSL5\_BT2}$ of the second beating signal of the phase-adjusted fifth branch signal PSL5 output from the second phase adjuster PMD2 may be respectively expressed in a complex number form as illustrated Equation 10 below.

$$E_{PSL5\_BT1}=A_1 \exp[j\omega_1(t-\tau_1)+\phi_{m2}],$$

$$E_{PSL5\_BT2}=A_2 \exp[j\omega_2(t-\tau_2)+\phi_{m2}], \quad \text{[Equation 10]}$$

In Equation 10, $\phi_{m2}$ is an adjustment phase value modulated by the second phase adjuster PMD2.

The second combiner CPM2 may generate the second combined signal CL2 by combining the phase-adjusted fifth branch signal PSL5 and sixth branch signal SL6. The electric field $E_{CL2}$ of the second combined signal CL2 may be expressed in a complex number form as illustrated in Equation 11 below.

$$E_{CL2}=A_1 \exp[j\omega_1(t-\tau_1)+\phi_{01}+\phi_{m2}]+A_2 \exp[j\omega_2(t-\tau_2)+\phi_{02}+\phi_{m2}]+A_1 \exp[j\omega_1(t-\tau_3)+\phi_{03}]+A_2 \exp[j\omega_2(t-\tau_4)+\phi_{04}], \quad \text{[Equation 11]}$$

The second photo mixer MIX2 may generate the reference signal Ref_THz proportional to the strength of the received second combined signal CL2 and to output the reference signal Ref_THz to the phase analyzer PHA. The strength of the reference signal Ref_THz output from the second photo mixer MIX2 may be proportional to the strength of the second combined signal CL2.

When the reference signal Ref_THz is output, only a component corresponding to a difference frequency between the first frequency $\omega 1$ and the second frequency $\omega 2$ may be effectively radiated. Accordingly, the strength $I_{Ref\_THz}$ of the reference signal Ref_THz output by the second photo mixer MIX2 may be expressed in a complex number form as illustrated in Equation 12 below.

$$\begin{aligned}I_{Ref\_THz} &= I_0 \text{Re}\{\exp[j\omega_{THz}t + j\phi_{Tx1} + j(\phi_{m2}-\phi_{m2})] + \\ &\quad \exp(j\omega_{THz}t + j\phi_{Tx2} + j\phi_{m2}) + \\ &\quad \exp(-j\omega_{THz}t + j\phi_{Tx3} + j\phi_{m2}) + \\ &\quad \exp(-j\omega_{THz}t + j\phi_{Tx4})\} \\ &= I_0\{\cos(\omega_{THz}t + \phi_{Tx2} + \phi_{m2}) + \\ &\quad \cos(\omega_{THz}t - \phi_{Tx3} - \phi_{m2}) + \\ &\quad \cos(\omega_{THz}t + \phi_{Tx1}) + \cos(\omega_{THz}t + \phi_{Tx4})\},\end{aligned} \quad \text{[Equation 12]}$$

In Equation 12, $\omega_{THz}$ represents the difference frequency $\omega 1-\omega 2$ between the first frequency $\omega 1$ and the second frequency $\omega 2$. $\phi_{Tx1}$, $\phi_{Tx2}$, $\phi_{Tx3}$, and $\phi_{Tx4}$ are phase offsets.

The phase offsets may be excluded by arranging an optical fiber delay line between the second splitter SPM2 and the second combiner CPM2 and between the second phase adjuster PMD2 and the second combiner CPM2, or through calibration measurement. Accordingly, the strength $I_{Ref\_THz}$ of the reference signal Ref_THz may be simply expressed as in Equation 13 below.

$$\begin{aligned}I_{Ref\_THz} &= I_0\{\cos(\omega_{THz}t + \phi_{m2}) + \cos(\omega_{THz}t - \phi_{m2}) + \\ &\quad 2\cos(\omega_{THz}t)\} \\ &= 2I_0 \cos(\omega_{THz}t)[1 + \cos(\phi_{m2})]\end{aligned} \quad \text{[Equation 13]}$$

The strength $I_{T\_THz}$ of the transmission signal T_THz output from the transmitting end TX based on the first branch signal SL1 may be expressed as in Equation 14 below by substituting a value of 0 in $\phi_{m2}$ in Equation 13.

$$I_{T\_THz}=4I_1 \cos(\omega_{THz}t), \quad \text{[Equation 14]}$$

When the transmission signal T_THz is irradiated toward the sample and passes through the sample, a phase shift may occur due to the sample. Accordingly, the strength $I_{R\_THz}$ of the transmission signal (hereinafter referred to as the reception signal R_THz) passing through the sample may be expressed as in Equation 15 below.

$$I_{R\_THz}=4I_1 \cos(\omega_{THz}t+\phi_s), \quad \text{[Equation 15]}$$

The phase analyzer PHA of the receiving end RX may express the measurement current obtained by multiplying the strength of the reception signal R_THz (Equation 15) by the strength of the reference signal Ref_THz (Equation 13) as in Equation 16 below.

$$I_m = 8I_0I_1\cos(\omega_{THz}t + \phi_s)[1 + \cos(\phi_{m2})]\cos(\omega_{THz}t) \quad \text{[Equation 16]}$$
$$= 4I_0I_1\{\cos(\phi_s) + \cos(2\omega_{THz}t + \phi_s)\}$$
$$[1 + cps)\phi_{m2})]$$

In the measurement current of Equation 16, the current component for the $2\omega_{THz}$ frequency term may appear as direct current due to too high a frequency in a conventional current meter.

In conclusion, the measurement current $I_m$ measured by the phase analyzer PHA may be expressed as in Equation 17 below.

$$I_m = 4I_0I_1 \cos(\phi_s)[1+\cos(\phi_{m2})], \quad \text{[Equation 17]}$$

The measured current for the phase adjustment value has a maximum value when the sample does not exist ($\phi_s=0$), and the strength may decrease according to the phase shift value ($\phi_s$) by the sample.

In the second embodiment, as in the first embodiment, the measured current has a uniform phase period and may have a maximum value. The phase analyzer PHA may measure the phase shift value by the sample by comparing the measurement current when the sample is not present with the measurement current when the sample is present.

Figure 9:
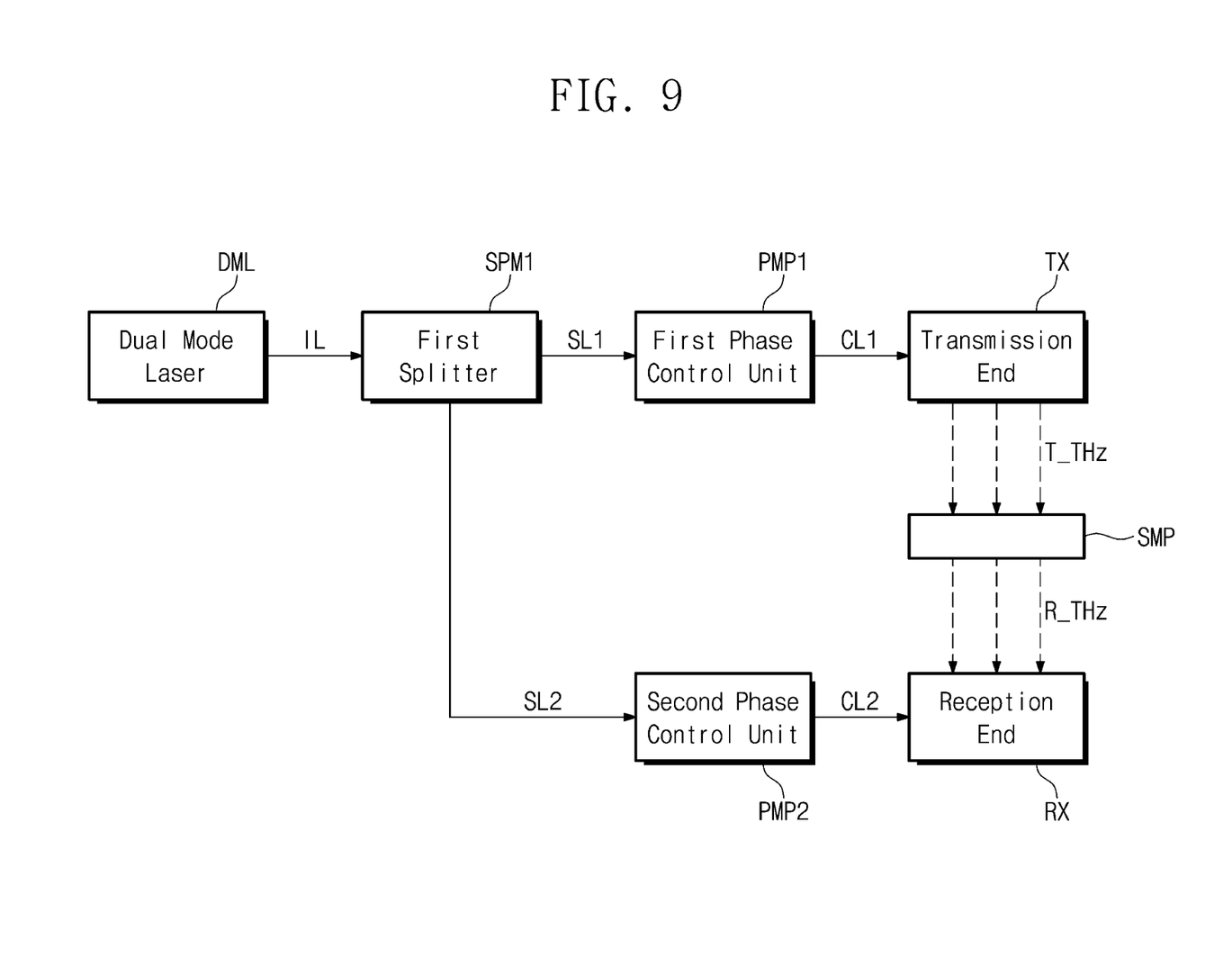
FIG. 9 is a diagram illustrating a third embodiment of a phase shift measuring device, according to the present disclosure.

FIG. 9 is a diagram illustrating a third embodiment of a phase shift measuring device, according to the present disclosure. Hereinafter, a third embodiment of the phase shift measuring device PHSD according to the present disclosure will be described in detail focusing on differences from the first and second embodiments.

Referring to FIG. 9, the phase shift measuring device PHSD of the present disclosure may include the dual mode laser DML, the first splitter SPM1, the first phase control unit PMP1, the second phase control unit PMP2, the transmitting end TX, and the receiving end RX.

The dual mode laser DML, the first splitter SPM1, the transmitting end TX, and the receiving end RX may be actually the same as those described with reference to FIGS. 1, 2, 4, and 5. The first phase control unit PMP1 may be actually the same as that described with reference to FIG. 3. The second phase control unit PMP2 may be actually the same as that described with reference to FIG. 8. Hereinafter, the second phase control unit PMP2 will be described in detail with reference to FIG. 8.

The first phase control unit PMP1 may include the second splitter SPM2, the first phase adjuster PMD1, and the first combiner CPM1. The first phase control unit PMP1 may receive the first branch signal SL1 and may output the first combined signal CL1. That is, the first phase control unit may operate in the same way as in the first embodiment.

The second phase control unit PMP2 may include the third splitter SPM3, the second phase adjuster PMD2, and the second combiner CPM2. The second phase control unit PMP2 may receive the second branch signal SL2 and may output the second combined signal CL2. The second phase control unit may operate in the same way as in the second embodiment.

The transmitting end TX may receive and mix two beating signals having different frequencies included in the first combined signal CL1. The transmitting end TX may mix the two beating signals and may generate the transmission signal T_THz, which is a continuous wave in the terahertz band, based on the mixed beating signals. The transmission signal T_THz generated by the transmitting end TX may be radiated into a free space.

The phase analyzer PHA included in the receiving end RX may measure the phase shift value by the sample based on the second combined signal CL2 and the reception signal R_THz. Hereinafter, an operation of the phase analyzer PHA in the third embodiment of the present disclosure will be described in detail.

The first phase control unit may operate in the same manner as in the first embodiment, and accordingly, the transmission signal output from the transmitting end may be expressed as in Equation 5 as described above through Equations 1 to 5.

Therefore, the strength $I_{R\_THz}$ of the transmission signal (hereinafter referred to as the reception signal R_THz) that is passed through the sample may be expressed as in Equation 6 above.

The second phase control unit may operate in the same manner as in the second embodiment, and accordingly, the strength $I_{Ref\_THz}$ of the reference signal generated at the receiving end may be expressed as in Equation 13 as described above through Equations 10 to 13.

In the third embodiment, the phase analyzer PHA of the receiving end RX may express the measurement current obtained by multiplying the strength of the reception signal R_THz (Equation 6) by the strength of the reference signal Ref_THz (Equation 13) as in Equation 18 below.

$$I_m = 4I_0I_1\cos(\omega_{THz}t + \phi_s)[1 + \cos(\phi_{m1})] \quad \text{[Equation 18]}$$
$$[1 + \cos(\phi_{m2})]\cos(\omega_{THz}t)$$
$$= 2I_0I_1\{\cos(\phi_s) + \cos(2\omega_{THz}t + \phi_s)\}$$
$$[1 + \cos(\phi_{m1})][1 + \cos(\phi_{m2})]$$

In the measurement current of Equation 18, the current component for the $2\omega_{THz}$ frequency term may appear as direct current due to too high a frequency in a conventional current meter.

In conclusion, the measurement current $I_m$ measured by the phase analyzer PHA may be expressed as in Equation 17 below.

$$I_m = 2I_0I_1 \cos(\phi_s)[1+\cos(\phi_{m1})][1+\cos(\phi_{m2})], \quad \text{[Equation 19]}$$

The measured current for the phase adjustment value has a maximum value when the sample does not exist ($\phi_s=0$), and the strength may decrease according to the phase shift value ($\phi_s$) by the sample.

In the third embodiment, as in the first embodiment, the measured current has a uniform phase period and may have a maximum value. The phase analyzer PHA may measure the phase shift value by the sample by comparing the measurement current when the sample is not present with the measurement current when the sample is present.

According to an embodiment of the present disclosure, a phase shift measuring device and a phase shift measuring method having improved performance using a double mode laser are provided.

The above description refers to embodiments for implementing the present disclosure. Embodiments in which a design is changed simply or which are easily changed may be included in the present disclosure as well as an embodiment described above. In addition, technologies that are easily changed and implemented by using the above embodiments may be included in the present disclosure. Accordingly, the scope of the present disclosure should not be limited to the above-described embodiments and should be defined by equivalents of the claims as well as the claims to be described later.

What is claimed is:

1. A phase shift measuring device comprising:
    a dual mode laser including a first beat light source generating a first beating signal and a second beat light source generating a second beating signal, and configured to output a dual mode signal including the first beating signal and the second beating signal;
    a first splitter configured to receive the dual mode signal to generate a first branch signal and a second branch signal, the first branch signal and the second branch signal being including the branched first beating signal and the branched second beating signal, respectively;
    a phase control unit configured to receive the first branch signal to generate a combined signal;
    a transmitting end configured to receive the combined signal from the phase control unit and to generate a transmission signal based on the combined signal; and
    a receiving end configured to receive the second branch signal from the first splitter and to generate a reference signal based on the second branch signal, and
    wherein the phase control unit includes:
        a second splitter configured to branch the first branch signal to generate a third branch signal and a fourth branch signal;
        a phase adjuster configured to adjust a phase of the third branch signal; and
        a combiner configured to generate the combined signal by combining the third branch signal of which the phase is adjusted by the phase adjuster and the fourth branch signal, and
    wherein the receiving end includes:
        a reception antenna configured to receive the transmission signal; and
        a phase analyzer configured to measure a phase shift based on the reference signal and the received transmission signal.

2. The phase shift measuring device of claim 1, wherein the transmitting end includes:
    a first photo mixer configured to generate the transmission signal by mixing a first beating signal and a second beating signal included in the combined signal received to the transmitting end; and
    a transmission antenna configured to output the transmission signal to an outside of the transmission end.

3. The phase shift measuring device of claim 2, wherein the receiving end includes a second photo mixer, and
    wherein the second photo mixer is configured to generate the reference signal by mixing a first beating signal and a second beating signal included in the second branch signal received to the receiving end.

4. The phase shift measuring device of claim 3, wherein the phase analyzer is configured to measure a measurement current by multiplying the transmission signal received by the reception antenna by the reference signal, and
    wherein the phase analyzer is configured to measure a phase shift value by a sample by comparing the measurement current when the sample is provided with the measurement current when the sample is not provided.

5. The phase shift measuring device of claim 2, wherein the first photo mixer includes:
    a coupler configured to generate a mixed beating signal by mixing the first beating signal and the second beating signal included in the combined signal, and
    an optical-to-electrical converter configured to modulate a photocurrent of a photodiode based on the mixed beating signal to generate the transmission signal.

6. The phase shift measuring device of claim 1, wherein a strength of the transmission signal output from the transmitting end is expressed by Equation 1, $$I_{T\_THz}=I_0\{\cos(\omega_{THz}t+\phi_{m1})+\cos(\omega_{THz}t-\phi_{m1})+2\cos(\omega_{THz}t)\},\quad \text{Equation 1:}$$

in Equation 1, $\phi_{m1}$ is an adjustment phase value modulated by the phase adjuster, $\omega_{THz}$ is a difference frequency $\omega 1-\omega 2$ between a first frequency $\omega 1$ of the first beating signal and a second frequency $\omega 2$ of the second beating signal, when the transmission signal is irradiated to the sample, a strength of the transmission signal received at the receiving end is expressed by Equation 2, $$I_m=4I_0I_1\cos(\phi_s)[1+\cos(\phi_{m1})],\quad \text{Equation 2:}$$

in Equation 2, $\phi_s$ is the phase shift value according to the sample.

7. The phase shift measuring device of claim 6, wherein a strength of the reference signal generated at the receiving end is expressed by Equation 3, $$I_{Ref\_THz}=4I_1\cos(\omega_{THz}t),\quad \text{Equation 3:}$$

in Equation 3, $\omega_{THz}$ is a difference frequency $\omega 1-\omega 2$ between a first frequency $\omega 1$ of the first beating signal and a second frequency $\omega 2$ of the second beating signal.

8. The phase shift measuring device of claim 7, wherein the phase analyzer is configured to obtain a measurement current expressed by Equation 4 by multiplying the strength of the received transmission signal by the strength of the reference signal, $$\text{Equation 4: } I_m=4I_0I_1\cos(\phi_s)[1+\cos(\phi_{m1})].$$

9. The phase shift measuring device of claim 1, wherein the dual mode laser includes a first single mode laser and a second single mode laser, and
    wherein the first single mode laser and the second single mode laser are a distributed feedback laser diode (DFB LD), a distributed Bragg reflector laser diode (DBR LD), a sampled grating distributed Bragg reflector (SGDBR) laser diode (SGDBR LD), or a wavelength tunable single mode laser diode.

10. A method of measuring a phase shift, the method comprising:
    outputting a dual mode signal including a first beating signal and a second beating signal through a dual mode laser;
    generating a first branch signal and a second branch signal by branching the dual mode laser, the first branch signal and the second branch signal being including the branched first beating signal and the branched second beating signal, respectively;
    receiving the first branch signal to generate a combined signal;
    receiving the combined signal to generate a transmission signal at a terahertz band;
    generating a reference signal based on the second branch signal; and receiving the transmission signal to measure a phase shift value based on the received transmission signal and the reference signal, and wherein the generating of the combined signal includes:

branching the first branch signal to generate a third branch signal and a fourth branch signal;

adjusting a phase of the third branch signal; and generating the combined signal by combining the third branch signal of which the phase is adjusted and the fourth branch signal.

11. The method of claim 10, wherein the generating of the transmission signal includes generating the transmission signal by mixing a first beating signal and a second beating signal included in the combined signal.

12. The method of claim 11, wherein the generating of the reference signal includes generating the reference signal by mixing a first beating signal and a second beating signal included in the second branch signal.

13. The method of claim 12, wherein the measuring of the phase shift value includes:

measuring a measurement current by multiplying the received transmission signal by the reference signal; and measuring the phase shift value by a sample by comparing the measurement current when the sample is provided with the measurement current when the sample is not provided.

14. The method of claim 10, wherein a strength of the transmission signal is expressed by Equation 1, $$I_{T\_THz}=I_0\{\cos(\omega_{THz}t+\phi_{m1})+\cos(\omega_{THz}t-\phi_{m1})+2\cos(\omega_{THz}t)\}, \quad \text{Equation 1:}$$

in Equation 1, $\phi_{m1}$ is an adjustment phase value modulated by a phase adjuster, $\omega_{THz}$ is a difference frequency $\omega 1-\omega 2$ between a first frequency $\omega 1$ of the first beating signal and a second frequency $\omega 2$ of the second beating signal, when the transmission signal is irradiated to the sample, a strength of the received transmission signal is expressed by Equation 2, $$I_m=4I_0I_1\cos(\phi_s)[1+\cos(\phi_{m1})], \quad \text{Equation 2:}$$

in Equation 2, $\phi_s$ is the phase shift value according to the sample.

15. The method of claim 14, wherein a strength of the reference signal is expressed by Equation 3, $$I_{Ref\_THz}=4I_1\cos(\omega_{THz}t), \quad \text{Equation 3:}$$

in Equation 3, $\omega_{THz}$ is a difference frequency $\omega 1-\omega 2$ between a first frequency $\omega 1$ of the first beating signal and a second frequency $\omega 2$ of the second beating signal.

16. The method of claim 15, further comprising:

obtaining a measurement current expressed by Equation 4 by multiplying the strength of the received transmission signal by the strength of the reference signal, and Equation 4: $I_m=4I_0I_1\cos(\phi_s)[1+\cos(\phi_{m1})]$.

17. A phase shift measuring device comprising:

a dual mode laser including a first beat light source generating a first beating signal and a second beat light source generating a second beating signal, and configured to output a dual mode signal including the first beating signal and the second beating signal;

a first splitter configured to receive the dual mode signal to generate a first branch signal and a second branch signal, the first branch signal and the second branch signal being including the branched first beating signal and the branched second beating signal, respectively;

a transmitting end configured to receive the first branch signal to generate a transmission signal based on the first branch signal;

a phase control unit configured to receive the second branch signal to generate a combined signal; and a receiving end configured to receive the combined signal from the phase control unit and to generate a reference signal based on the combined signal, and wherein the phase control unit includes:

a second splitter configured to branch the second branch signal to generate a third branch signal and a fourth branch signal;

a phase adjuster configured to adjust a phase of the third branch signal; and a combiner configured to generate the combined signal by combining the third branch signal of which the phase is adjusted by the phase adjuster and the fourth branch signal, and wherein the receiving end includes:

a receiving antenna configured to receive the transmission signal; and a phase analyzer configured to measure a phase shift based on the reference signal and the received transmission signal.

18. The phase shift measuring device of claim 17, wherein the transmitting end includes:

a first photo mixer configured to generate the transmission signal by mixing a first beating signal and a second beating signal included in the first branch signal received to the transmitting end; and a transmission antenna configured to output the transmission signal to an outside of the transmission end.

19. The phase shift measuring device of claim 17, wherein the receiving end includes a second photo mixer, and wherein the second photo mixer is configured to generate the reference signal by mixing a first beating signal and a second beating signal included in the combined signal received to the receiving end.

20. The phase shift measuring device of claim 17, wherein the phase analyzer is configured to measure a measurement current by multiplying the transmission signal received by the receiving antenna by the reference signal, and wherein the phase analyzer is configured to measure a phase shift value by a sample by comparing the measurement current when the sample is provided with the measurement current when the sample is not provided.

* * * * *